United States Patent
Chang et al.

(10) Patent No.: US 7,094,711 B2
(45) Date of Patent: Aug. 22, 2006

(54) MICRO PIPE MANUFACTURING METHOD

(75) Inventors: Ming-Chih Chang, Sinyuan Township, Ping Tung County (TW); Tsong-Mu Lai, Thubei (TW); Hua-Shu Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 301 days.

(21) Appl. No.: 10/808,647

(22) Filed: Mar. 25, 2004

(65) Prior Publication Data

US 2005/0215025 A1  Sep. 29, 2005

(51) Int. Cl.
*H01L 21/469* (2006.01)
(52) U.S. Cl. ............... 438/781; 438/619; 438/700; 438/989
(58) Field of Classification Search ............ 438/619, 438/700, 781, 949
See application file for complete search history.

(56) References Cited

U.S. PATENT DOCUMENTS

| 6,096,656 | A  | * | 8/2000 | Matzke et al. ............ 438/702 |
| 2002/0048840 | A1 | * | 4/2002 | Tanigawa ................ 438/65 |
| 2004/0166606 | A1 | * | 8/2004 | Forehand ................ 438/106 |
| 2005/0031997 | A1 | * | 2/2005 | Chang et al. ............ 430/320 |
| 2005/0072946 | A1 | * | 4/2005 | Studer et al. ............ 251/11 |

* cited by examiner

*Primary Examiner*—Mary Wilczewski
*Assistant Examiner*—Toniae M. Thomas
(74) *Attorney, Agent, or Firm*—Tung & Associates

(57) ABSTRACT

A method for fabricating micro pipes on a semiconductor wafer or other substrate. According to the method of the invention, a base layer is initially deposited on the substrate and then etched to form a trench which exposes the surface of the substrate. Next, a PR (photoresist) layer of selected thickness is deposited over the base layer and the trench. Finally, in a curing step, the deposited photoresist is irradiated with ionizing radiation to cause outgassing of nitrogen gas from the photoresist layer, between the PR layer and the substrate. This step facilitates buckling of the PR layer into an arcuate bubble which defines the semispherical micro pipe structure.

20 Claims, 1 Drawing Sheet

MICRO PIPE MANUFACTURING METHOD

FIELD OF THE INVENTION

Figure 1A:
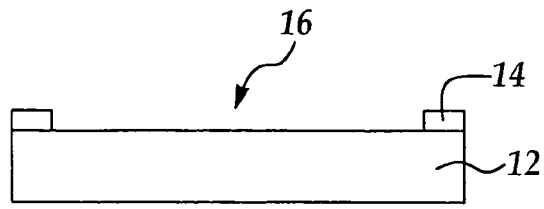

The present invention generally relates to the manufacturing of micro structural components and more particularly, to an improved method of manufacturing micro pipes in semiconductor fabrication or other applications.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

A current drive in the semiconductor device industry is to produce semiconductors having an increasingly large density of integrated circuits which are ever-decreasing in size. These goals are achieved by scaling down the size of the circuit features in both the lateral and vertical dimensions. Vertical downscaling requires that the thickness of gate oxides on the wafer be reduced by a degree which corresponds to shrinkage of the circuit features in the lateral dimension. While there are still circumstances in which thicker gate dielectrics on a wafer are useful, such as to maintain operating voltage compatibility between the device circuits manufactured on a wafer and the current packaged integrated circuits which operate at a standard voltage, ultrathin gate dielectrics will become increasingly essential for the fabrication of semiconductor integrated circuits in the burgeoning small/fast device technology.

In micro-electromechanical systems (MEMS) and other technologies, voids may be intentionally formed in a substrate to create controlled micro channel structures. In integrated circuit fabrication, these micro channels or pipes may be used to cool the substrate or semiconductor devices fabricated thereon. In addition, micro pipes may be fabricated on substrates and used as channels for fluid control and movement.

Micro pipes are conventionally formed on a substrate by initially forming a V-shaped or U-shaped groove in the substrate. The groove is then covered with a layer of lid-glass. However, this technique is sometimes difficult to carry out and is unsuitable for fabrication of multi-layered micro piping.

Another method of manufacturing and using micro pipe systems is disclosed in U.S. Pat. Nos. 6,031,286 and 6,228,744, both assigned to IBM. According to that method, micro pipes are fabricated in a semiconductor device or other suitable substrate by controlling the aspect ratio of trenches as well as controlling the deposition characteristics of the material used to fill the trenches. A buried micro pipe is formed by filling a trench that has a height which is larger than a width thereof, so that the trench filler material lines sidewalls and bottom of the trench, and covers the top of the trench to form the micro pipe within the trench. Another layer can be formed over the filler material and planarized. Alternatively, the filler material itself can be planarized. Forming trenches in the planarized layer and repeating the above steps forms a second set of buried micro pipes in these new trenches. This forms a semiconductor device having multiple layer of buried micro pipes. Via holes may be etched to contact a micro pipe, or to interconnect micro pipes buried at different levels. Thus, instead of eliminating defective voids in trenches, the voids are controlled to form the micro pipes, which may be used to circulate a cooling fluid, or lined with a conductive material to form a micro light pipe channel or buried conductive pipes.

One of the limitations inherent in the conventional methods of fabricating micro pipes is that the methods are unsuitable for fabricating relatively large micro pipes of a size on the order of about 30~200 m in diameter. Accordingly, an improved micro pipe fabrication method is needed which is easy to carry out, applicable to a variety of technologies and is capable of fabricating multi-layered and larger-sized micro pipes.

An object of the present invention is to provide an improved method for fabricating micro pipes on a substrate.

Another object of the present invention is to provide an improved method which is capable of fabricating multiple layers of micro pipes on a substrate.

Still another object of the present invention is to provide an improved micro pipe fabrication method which is easy to carry out.

Yet another object of the present invention is to provide an improved micro pipe fabrication method which is suitable for fabricating micro pipes on the order of about 30~200 m in diameter.

A still further object of the present invention is to provide an improved micro pipe fabrication method which is applicable to semiconductor fabrication as well as biotech or other technologies.

SUMMARY OF THE INVENTION

In accordance with these and other objects and advantages, the present invention is generally directed to an improved method for fabricating micro pipes on a semiconductor wafer or other substrate. According to the method of the invention, a base layer is initially deposited on the substrate and then etched to form a trench which exposes the surface of the substrate. Next, a PR (photoresist) layer of selected thickness is deposited over the base layer and the trench. Finally, in a curing step, the deposited photoresist is irradiated with ionizing radiation to cause outgassing of nitrogen gas from the photoresist layer, between the PR layer and the substrate. This step facilitates buckling of the PR layer into an arcuate bubble which defines the semispherical micro pipe structure.

The base layer may be a metal or an oxide. Suitable metals include aluminum, copper and titanium nitride, for example. The trench may be cut in the base layer using reactive ion etching (RIE) or any other suitable alternative method. The photoresist material deposited on the base layer and trench is preferably a positive polymeric photoresist. During the curing step, the photoresist is subjected to ionizing radiation such as UV radiation, for example, and may be heated simultaneously during at least a portion of the irradiation to produce a generally arcuate photoresist portion that completes the upper portion of the micro pipe or channel.

SUMMARY OF THE INVENTION

Figure 1B:
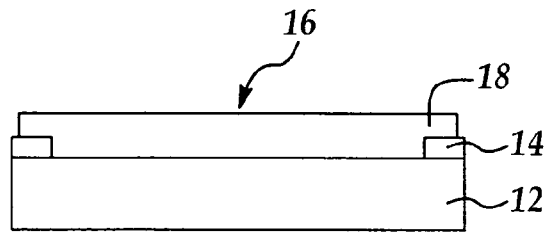
Figure 1C:
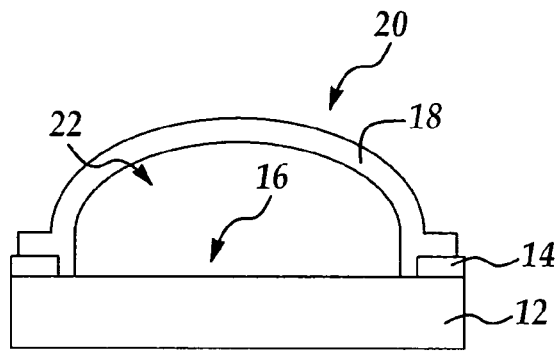
Figure 2:
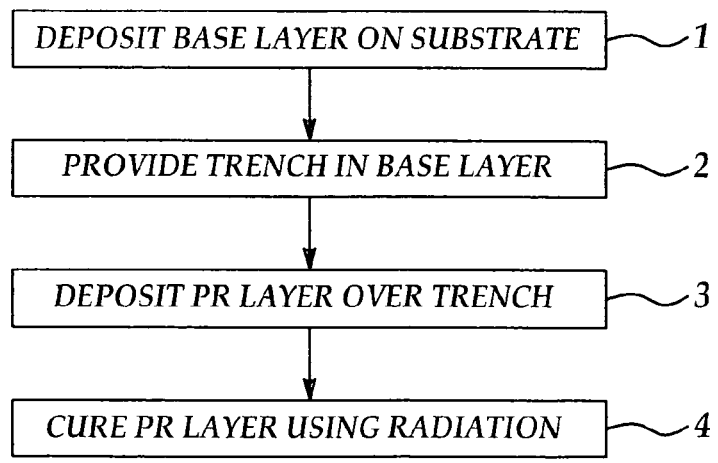

The invention will now be described, by way of example, with reference to the accompanying drawings, in which:

FIGS. 1A–1C are cross-sectional side views of a portion of a micro pipe at various stages of fabrication of the micro pipe on a substrate according to the method of the present invention; and FIG. 2 is a process flow diagram illustrating sequential steps according to the method of the present invention.

DESCRIPTION OF THE PREFERRED EMBODIMENTS

The present invention has particularly beneficial utility in the manufacture of micro pipes on semiconductor wafer substrates in the fabrication of integrated circuits on the substrates. However, the invention is not so limited in application and is more generally applicable to any microelectromechanical (MEM) fabrication process in a variety of industrial and mechanical applications in which the formation of micro pipes is desired for various purposes.

In a first embodiment of the invention, a metal or oxide base layer is formed on a substrate. A trench is then cut in the base layer to expose the surface of the substrate. A layer of photoresist is then blanket-deposited over the base layer and the patterned trench. Next, the photoresist is subjected to ionizing radiation to cause photoresist outgassing where at least a portion of the gas effluent is trapped beneath the photoresist layer to produce a curved or arcuate surface over the trench.

In one embodiment, the ionizing radiation is ultraviolet (UV) radiation. Preferably, for convenience of ionizing radiation sources available, the wavelength is in the ultraviolet light range of from about 100 nm to about 350 nm, and preferably, about 250 nm. It will be appreciated that the UV irradiation may include a variable bandwidth of wavelengths. In addition, exposure to deep ultraviolet (DUV) radiation (190–300 nm) is suitably useful. Convenient UV sources are high pressure xenon or mercury-xenon arc lamps fitted with appropriate optical filters to select the desired wavelengths for exposing the photoresist layer.

It will be appreciated that the UV radiation exposure process may use other UV radiation sources such as a multi-photon process initiated by a high intensity source of ionizing radiation such as a laser for a controlled period of illumination to produce outgassing and deformation of the photoresist layer while avoiding bursting the photoresist layer. For example, an argon ion laser operating in the UV mode at several wavelengths near 350 nm is desirable. Also, a frequency-doubled argon ion laser with output near 257 wavelength is highly desirable.

In another embodiment, short wavelength coherent ionizing radiation is useful for the practice of this invention. For example, x-ray, electron beams or ion beam excitation may be suitably utilized. In this embodiment, the photoresist layer deposited over the patterned substrate is optionally disposed in a variable pressure environment, for example from about 10–6 Torr to about 100 Torr to controllably vary the rate of outgassing from the photoresist upon exposure to ionizing radiation. It will be appreciated that the ambient pressure may be varied during the photoresist curing process (exposure to ionizing radiation) for all forms of ionizing radiation to control an outgassing rate of the photoresist and to thereby control a rate of photoresist deformation to produce an arcuate shaped (e.g., convex or concave) photoresist layer portion.

In one embodiment, a photoresist baking (heating) step is carried out simultaneously during at least a portion of the ionizing irradiation step. For example, the photoresist baking step accelerates polymeric cross-linking reaction in the photoresist to stabilize the photoresist. Additionally, depending on the temperature, the photoresist may initially be softened to enhance the deformation produced by the photoresist outgassing. Thus the heating temperature may be controllably altered to achieve an arcuate photoresist layer portion with a selected radius of curvature. The application of UV irradiation is in one aspect of the invention believed to form a hardened shell at least in the upper portion of the photoresist layer where UV light penetrates at least an upper portion of the photoresist layer during and following photoresist layer deformation to promote photoresist cross-linking reactions to stabilize the arcuate shape produced by photoresist outgassing. In operation, depending on the chemical makeup of the photoresist, upon exposure of the photoresist to either heat or light, chemical reactions are promoted that result in the release of gas from the photoresist, which gas upon building up a pressure greater than the ambient tends to displace the photoresist layer upwardly from the underlying material layer, which may be, for example, silicon.

For example, the application of the baking step may be delayed for a predetermined period of time after beginning the ionizing radiation, for example UV radiation, to first form a hardened surface shell portion of the photoresist prior to substantial deformation caused by outgassing. Application of heat to the photoresist layer in the baking step simultaneous with continued UV exposure promotes additional photoresist cross-linking reactions allowing a degree of control over the extent of deformation and therefore, the final radius of curvature of the arcuate-shaped portion of the photoresist layer. Depending on the heating temperature and the thickness of the photoresist layer, the thermal curing process may also accelerate the production of gas while the UV radiation initiates polymer cross-linking reactions primarily limited to the exposed surface portions of the photoresist layer act to stabilize the exposed surface portions to slow the rate of gas escape and to strengthen an upper shell of the photoresist layer to prevent bursting of the photoresist layer. Thus, selective control of both the the rate of outgassing together with the strength of the photoresist by selected application of both ionizing radiation, for example UV radiation, and heat to the photoresist layer allow control over the final radius of curvature of a deformed portion (arcuate shaped portion) of the photoresist layer. For example, the application of the UV radiation may be delayed for a predetermined period following application of heat to the photoresist surface to vary a radius of curvature of the curved (spheroid) photoresist surface portion. For example, the application of heat to the photoresist layer above a temperature of about 150 degrees C. may lead to an initial softening or flowability of the photoresist layer together with photoresist outgassing, thus enhancing the extent of deformation of the photoresist layer while applying UV radiation forms a hardened shell at the surface portion of the photoresist layer where the major portion of the UV radiation is absorbed to stabilize the deformed photoresist layer portion. By altering various processing variables including radiation intensity, temperature, and ambient pressure, including the relative order of application or variation thereof, a radius of curvature of produced arcuate portions of the photoresist layer over the patterned openings may be controllably varied.

It will be appreciated that the radius of curvature of the deformed photoresist portions may be dependent on a variety of factors including the photoresist material type, the thickness of the photoresist layer, the width and depth of the patterned openings, the wavelength and intensity of irradiation, and the ambient pressure. It will be appreciated that any or all of these variables may be altered to produce a variable radius of curvature.

Various photoresist materials may be suitably used with the method of the present invention although some may be preferable to others. For example, using conventional diazonapthoquinone (DNQ)/Novolac photoresists, irradiation with UV radiation having a wavelength of less than about 320 nm can promote cross-linking. In addition, photoresists strongly absorb UV radiation and therefore limit the UV absorption to an upper portion (shell) of the photoresist layer. Alternatively, chemically-amplified DUV photoresists, including positive photoresists, also strongly absorb UV light at DUV wavelengths, for example less than about 300 nm, and promote cross-linking and form a hardened or stabilized photoresist layer surface portion which is stabilized against flowing at higher temperatures. Different photoresist materials may have different rates of photoresist cross-linking and photoresist outgassing under given irradiation and heating conditions, making selection of the photoresist material a variable factor in achieving a controlled radius of curvature of a produced arcuate portion of a photoresist layer.

Referring to FIGS. 1A–1C, an exemplary implementation of the method of the present invention is shown for fabricating a micro pipe on a substrate. Shown are cross-sectional side views of a portion of a substrate at various stages of fabrication of an exemplary micro pipe 20, shown in FIG. 1C. Referring initially to FIG. 1A, a semiconductor substrate 12, which may be silicon, includes an overlying base layer 14 of metal or oxide. For example, the base layer 14 may be a metal such as aluminum, copper or titanium nitride, in non-exclusive particular, or oxide deposited on the substrate 12 according to methods which are known by those skilled in the art. A trench 16 is then etched in the base layer 14 to expose the surface of the silicon substrate 12. For example, a reactive ion etching (RIE) process following a conventional photolithographic patterning step, or a wet etching process may be used to form the trench 16. It will be appreciated that the thickness of the base layer 14 may vary depending on the size or width of the micro pipe 20 to be produced. For example, the thickness of the base layer 14 is preferably about 1,000 Angstroms thick to about 10,000 Angstroms thick. For example, micro pipes 20 may be created with diameter of about 100 microns to about 1 millimeter depending on the application. It is desirable that the base layer 14 be about ¼ to about ¾ the thickness of the subsequently deposited photoresist layer 18 to provide an adequate anchoring support for the photoresist layer 18 upon deformation to produce a arcuate (curved) surface.

Referring next to FIG. 1B, a layer 18 of photoresist is blanket deposited over the base layer 14 and the trench 16, for example using a conventional spin-coating process. It will be appreciated that the thickness of the photoresist layer 18 will vary depending on the desired radius of curvature desired and the diameter of the micro pipe 20, which diameter roughly corresponds to the width of the trench 16. For example, the thickness of the photoresist layer 18 should be about 1/100 to about 1/5 of the width of the trench 16 to provide sufficient gas generation for photoresist deformation while allowing formation of a stable photoresist surface without bursting following photoresist curing to achieve, for example, an arcuate surface approaching a radius of curvature of a sphere. It will be appreciated that the thickness of the photoresist layer 18 will be altered to vary a radius of curvature; however, preferably the photoresist layer 18 is sufficiently thick to provide both sufficient gas generation for surface deformation and a stable deformed photoresist layer following UV radiation exposure with optional heating. For example, the thickness of the photoresist layer 18 may typically range from about 1 m to about 10 m, and is preferably about 4 m.

Referring next to FIG. 1C, in a final step fabrication of the micro pipe 20 is completed by irradiating the photoresist layer 18 with ionizing radiation. In an exemplary implementation of the invention, the photoresist layer 18 is typically subjected to substantially simultaneous application of UV irradiation and heat. For example, the UV irradiation may be supplied by a mercury-xenon lamp (not shown) at about 300 Watts and optionally including a filter for limiting wavelength exposure to less than about 350 nm while simultaneously heating the photoresist layer 18 at a temperature of typically from about 150 degrees C. to about 300 degrees C. The heat may be separately applied by a furnace or a resistively-heated support plate (not shown). Optionally, the photoresist temperature may be ramped up to temperature at about 10 degrees C./min to about 30 degrees C./min while the photoresist layer 18 is simultaneously irradiated. The application of both UV radiation and heat is preferably maintained at typically from about 150 degrees C. to about 300 degrees C. for about 30 minutes to about 1 hour. The intensity of the UV radiation is preferably about 100 mjoule/cm2. During the heating and irradiation step, the outgassing of nitrogen gas from the photoresist layer 18 into the junction between the photoresist layer 18 and the underlying substrate 12 tends to push the photoresist layer 18 upwardly into an arcuate or semispherical shape, as shown in FIG. 1C, while the edges of the photoresist layer 18 remain anchored to the base layer 14. The arcuate photoresist layer 18 defines the upper portion, whereas the substrate 12 defines the bottom portion, of the micro pipe 20. A pipe lumen 22 of the micro pipe 20 is thus defined between the photoresist layer 18 and the micro pipe 20 and is suitable for cooling semiconductor devices fabricated on the substrate 12, for example. In some applications, the pipe lumen 22 may be adapted for circulating fluids (not shown) throughout a micro piping network defined by multiple interconnecting micro pipes 20. Preferably, the photoresist curing treatment is carried out for a sufficient period of time to sufficiently stabilize the photoresist layer 18 against flow during subsequent semiconductor or substrate processing steps where the temperature of the photoresist layer 18 may reach temperatures of about 150 degrees C. to about 200 degrees C.

Referring next to FIG. 2, a typical process flow diagram which summarizes sequential steps according to a typical method of the present invention is shown. In process step 1, a metal or oxide base layer is initially deposited on a substrate. In process step 2, a trench is cut in the base layer. In process step 3, a PR (photoresist) layer is deposited over the base layer and patterned to cover the etched trench. In process step 4, the PR layer is cured according to preferred embodiments using ionizing radiation, for example UV radiation, and optionally by simultaneously heating the PR layer during at least a portion of the UV irradiation to produce arcuate photoresist portions each disposed over the trench and having a predetermined radius of curvature.

While the preferred embodiments of the invention have been described above, it will be recognized and understood that various modifications can be made in the invention and the appended claims are intended to cover all such modifications which may fall within the spirit and scope of the invention.

What is claimed is:

1. A method of fabricating a micro pipe, comprising the steps of:
    providing a substrate;
    providing a base layer on said substrate;
    providing a trench in said base layer;
    providing a photoresist layer on said base layer and covering said trench; and
    imparting a generally arcuate configuration to said photoresist layer by subjecting said photoresist layer to ionizing radiation.

2. The method of claim 1 further comprising the step of heating said photoresist layer during said subjecting said photoresist layer to ionizing radiation.

3. The method of claim 1 wherein said base layer comprises a material selected from the group consisting of a metal and an oxide.

4. The method of claim 3 further comprising the step of heating said photoresist layer during said subjecting said photoresist layer to ionizing radiation.

5. The method of claim 1 wherein said ionizing radiation comprises UV radiation.

6. The method of claim 5 further comprising the step of heating said photoresist layer during said subjecting said photoresist layer to ionizing radiation.

7. The method of claim 5 wherein said base layer comprises a material selected from the group consisting of a metal and an oxide.

8. The method of claim 7 further comprising the step of heating said photoresist layer during said subjecting said photoresist layer to ionizing radiation.

9. A method of fabricating a micro pipe, comprising the steps of:
    providing a substrate;
    providing a base layer on said substrate;
    providing a trench in said base layer;
    providing a photoresist layer having a thickness of from about 1 um to about 10 um on said base layer and covering said trench; and
    imparting a generally arcuate configuration to said photoresist layer by subjecting said photoresist layer to ionizing radiation.

10. The method of claim 9 further comprising the step of heating said photoresist layer to a temperature of from about 150 degrees C. to about 300 degrees C. during said subjecting said photoresist layer to ionizing radiation.

11. The method of claim 9 wherein said base layer comprises a material selected from the group consisting of aluminum, copper, titanium nitride and an oxide.

12. The method of claim 11 further comprising the step of heating said photoresist layer to a temperature of from about 150 degrees C. to about 300 degrees C. during said subjecting said photoresist layer to ionizing radiation.

13. The method of claim 9 wherein said ionizing radiation comprises UV radiation having a wavelength of from about 100 nm to about 350 nm.

14. The method of claim 13 further comprising the step of heating said photoresist layer to a temperature of from about 150 degrees C. to about 300 degrees C. during said subjecting said photoresist layer to ionizing radiation.

15. The method of claim 13 wherein said base layer comprises a material selected from the group consisting of aluminum, copper, titanium nitride and an oxide.

16. The method of claim 15 further comprising the step of heating said photoresist layer to a temperature of from about 150 degrees C. to about 300 degrees C. during said subjecting said photoresist layer to ionizing radiation.

17. A method of fabricating a micro pipe, comprising the steps of:
    providing a substrate;
    providing a base layer on said substrate;
    providing a trench in said base layer;
    providing a positive polymeric photoresist layer on said base layer and covering said trench; and
    imparting a generally arcuate configuration to said photoresist layer by subjecting said photoresist layer to ionizing radiation.

18. The method of claim 17 further comprising the step of heating said photoresist layer to a temperature of from about 150 degrees C. to about 300 degrees C. during said subjecting said photoresist layer to ionizing radiation.

19. The method of claim 17 wherein said base layer comprises a material selected from the group consisting of aluminum, copper, titanium nitride and an oxide.

20. The method of claim 17 wherein said ionizing radiation comprises UV radiation having a wavelength of from about 100 nm to about 350 nm.

* * * * *